(12) United States Patent
Miyagawa et al.

(10) Patent No.: US 10,277,006 B2
(45) Date of Patent: Apr. 30, 2019

(54) LIGHT-EMITTING DEVICE AND DISTANCE MEASUREMENT DEVICE

(71) Applicant: TOPCON CORPORATION, Itabashi-ku, Tokyo (JP)

(72) Inventors: Suguru Miyagawa, Tokyo (JP); Yoshiaki Goto, Tokyo (JP); Yoshikatsu Tokuda, Tokyo (JP)

(73) Assignee: TOPCON CORPORATION, Itabashi-Ku, Tokyo (JP)

( * ) Notice: Subject to any disclaimer, the term of this patent is extended or adjusted under 35 U.S.C. 154(b) by 0 days.

(21) Appl. No.: 15/570,415

(22) PCT Filed: Apr. 28, 2016

(86) PCT No.: PCT/JP2016/063407
§ 371 (c)(1),
(2) Date: Oct. 30, 2017

(87) PCT Pub. No.: WO2016/175301
PCT Pub. Date: Nov. 3, 2016

(65) Prior Publication Data
US 2018/0109073 A1    Apr. 19, 2018

(30) Foreign Application Priority Data

Apr. 30, 2015 (JP) ................. 2015-092824

(51) Int. Cl.
*H01S 5/042* (2006.01)
*G01S 17/10* (2006.01)
(Continued)

(52) U.S. Cl.
CPC ............. *H01S 5/042* (2013.01); *G01R 15/22* (2013.01); *G01S 7/484* (2013.01); *G01S 7/497* (2013.01);
(Continued)

(58) Field of Classification Search
CPC .... H01S 5/042; H01S 3/0057; H01S 5/06835; H01S 5/0683; G01R 15/22; H04B 10/504; G01S 7/497; G01S 7/484; G01S 17/10
See application file for complete search history.

(56) References Cited

U.S. PATENT DOCUMENTS 5,062,113 A   10/1991   Takahashi
5,289,114 A   2/1994    Nakamura et al.
(Continued)

FOREIGN PATENT DOCUMENTS

JP    S55-107282 A    8/1980
JP    S57-39593 A     3/1982
(Continued)

OTHER PUBLICATIONS

International Search Report dated Jul. 26, 2016, in connection with International Patent Application No. PCT/JP2016/063407, 3 pgs.

*Primary Examiner* — Xinning (Tom) Niu
(74) *Attorney, Agent, or Firm* — Chiesa Shahinian & Giantomasi PC

(57) ABSTRACT

Provided is a technology for suppressing variations in the waveform of a light emission pulse caused by various factors in a light-emitting device. A light-emitting device is provided with: a light source 101 in which relaxation oscillation occurs immediately after energization; a light source drive circuit 104 which includes a differentiation circuit 102 having a resistor and a capacitor connected in parallel, and in which a switching element 103 for voltage application is connected in series with the differentiation circuit; a power supply circuit 105; a light-reception element 107 which detects pulsed light emitted from the light source 101; and a voltage control unit 109 which controls an output voltage from the power supply circuit 105 in correspondence with the waveform of the detected pulsed light.

1 Claim, 12 Drawing Sheets

(51) Int. Cl.
  *G01S 7/484*    (2006.01)
  *H01S 5/0683*   (2006.01)
  *G01R 15/22*    (2006.01)
  *H01S 3/00*     (2006.01)
  *H04B 10/50*    (2013.01)
  *G01S 7/497*    (2006.01)

(52) U.S. Cl.
  CPC ............ *G01S 17/10* (2013.01); *H01S 3/0057* (2013.01); *H01S 5/0683* (2013.01); *H01S 5/06835* (2013.01); *H04B 10/504* (2013.01)

(56) References Cited

U.S. PATENT DOCUMENTS 5,371,755 A * 12/1994 Murata .................. H01S 5/042
                                                    372/38.02
2003/0099178 A1 * 5/2003 Sho ........................ G11B 7/126
                                                    369/53.26
2004/0109696 A1   6/2004 Toshihisa
2014/0312233 A1 * 10/2014 Mark ........................ G01J 1/46
                                                    250/341.8

FOREIGN PATENT DOCUMENTS

| | | |
|---|---|---|
| JP | S59-28396 A | 2/1984 |
| JP | H04-60464 A | 2/1992 |
| JP | H07-109911 B2 | 11/1995 |
| JP | 2000-058956 A | 2/2000 |
| JP | 2002-333476 A | 11/2002 |
| JP | 2002-368329 A | 12/2002 |
| JP | 2004-172237 A | 6/2004 |
| JP | 2011-187157 A | 9/2011 |
| JP | 2012-033541 A | 2/2012 |
| JP | 2014-169427 A | 9/2014 |
| JP | 2014-169429 A | 9/2014 |

* cited by examiner

When Vp is smaller than Vth, the FET is not switched on.

When Vb is greater than Vth, the FET is switched on at any time and cannot be made to be switched off.

LIGHT-EMITTING DEVICE AND DISTANCE MEASUREMENT DEVICE

CROSS-REFERENCE TO RELATED APPLICATIONS

This application is a U.S. national phase filing under 35 U.S.C. § 371 of International Application No. PCT/JP2016/063407, filed Apr. 28, 2016, and claims priority thereto under 35 U.S.C. § 119 to Japanese Patent Application No. 2015-092824, filed Apr. 30, 2015, the entireties of both of which are incorporated by reference herein.

TECHNICAL FIELD

The present invention relates to a light emitting device configured to emit light in pulses.

BACKGROUND ART

In technologies for measuring distances, for machining of various types, or for other purposes, by using laser light, a short pulsed laser light with a pulse width of several tens to not more than several hundreds of picoseconds may be desirable. For example, in the technology for measuring distances, pulsed light with a narrow pulse width can enhance the accuracy of measuring distances. Known techniques for generating laser light with a narrow pulse width are described in, for example, Japanese Examined Patent Application Publication No. 7-109911 and Japanese Unexamined Patent Applications Laid-Open Nos. 55-107282 and 2002-368329.

FIG. 1 shows a relationship between driving current and output light of a laser diode (LD). As shown in FIG. 1, while driving current is applied to the LD, the LD emits light that has a pulse-like shape at first, but that gradually attenuates to have a constant intensity. This phenomenon is typical in common semiconductor lasers. This oscillation in light intensity, which occurs in the initial stage of the light emission and gradually attenuates, is called "relaxation oscillation".

To generate light with a short pulse width, as shown in FIG. 2, driving current may be applied for a very short period Δt to allow only emission of the initial pulsed light. However, the period Δt is on the order of several tens to several hundreds of picoseconds, and driving current is difficult to generate only in the period Δt in a simple circuit.

Under these circumstances, the inventors of the present invention applied for patents relating to a device that is configured to emit short pulsed light by using a circuit including a capacitor and a resistor in parallel connection (Japanese Patent Applications Nos. 2014-169427 and 2014-169429). In the technique used in this device, generation of inrush current to a capacitor and subsequent voltage drop at a resistor are used to make pulse-like current corresponding to one pulse flow to an LD momentarily, thereby enabling emission of light with a short pulse width.

Typical LDs vary their characteristics according to temperature. More specifically, even when the light emission setting is the same, the waveform and the peak intensity of the emitted pulsed light vary according to temperature. Temperature can also affect the characteristics of various types of electronic components such as a resistor, a capacitor, and a transistor.

In the distance measuring technique using laser light, the emission intensity and the pulse waveform of measurement pulsed light affect the distance measurement range and the distance measurement accuracy. Such influence of temperature may be avoided by using a thermostatic device, which can constantly maintain the temperatures of an LD and a light source driving circuit to reduce the influence of temperature variation. However, this method requires further consideration because the thermostatic device is a complicated structure with a heater and a Peltier element, and thus, the thermostatic device can be expensive and can consume a great amount of electric power.

The intensity and the waveform of emitted pulsed light are also susceptible to variations in the characteristics of an LD, a resistor, a capacitor, and other electronic components. In response to this problem, use of high precision components, strict selection of components, thorough adjustment in production of the light emitting device, or other measures may be taken, but they can increase production cost. Nevertheless, a finished product with a stabilized performance can still be affected by the temperature variation as described above.

The characteristics of electronic components can vary over time, which also affects the characteristics of the emitted light. This influence is typically eliminated by replacing or readjusting corresponding components. However, replacing or readjusting of the components takes time and has costs.

DISCLOSURE OF THE INVENTION

In view of these circumstances, an object of the present invention is to provide a technique for suppressing variation in the waveform of emitted pulsed light in a light emitting device due to various factors.

A first aspect of the present invention provides a light emitting device including a light source, a light source driving circuit, a power supply, a pulsed light measuring part, and a voltage controlling part. The light source emits pulsed light having relaxation oscillation immediately after being supplied with electric current. The light source driving circuit includes a differentiation circuit having a resistor and a capacitor in parallel connection and includes a switching element for applying voltage in serial connection to the differentiation circuit, and the light source driving circuit is serially connected to the light source. The power supply applies voltage to the serial circuit of the light source and the light source driving circuit. The pulsed light measuring part measures the pulsed light emitted from the light source. The voltage controlling part controls the voltage to be applied to the light source in response to the waveform of the pulsed light measured by the pulsed light measuring part.

The light emitting device according to the first aspect of the present invention is configured to measure the waveform of emitted light and feedback-control the voltage to be applied to the light source so that the waveform of emitted light will satisfy a predetermined condition. This structure enables compensation for variation in the waveform (e.g., variation in the peak value and variation in the shape) of emitted light due to the influence of temperature and the influence of precision of parts by adjusting voltage.

Generation of relaxation oscillation immediately after electric current is supplied is known as a typical characteristic of lasers, and a semiconductor laser (LD) may be used as the light source because it can particularly easily produce this phenomenon. The resistor is an electronic component having a predetermined electric resistance. The resistor includes a variety of resistive elements that are available as resistance devices, a resistor using wiring, or a resistor using a conductor or a semiconductor of each type. Although a resistor that exhibits electric resistance characteristics based on Ohm's law is widely used, a non-linear element, such as a diode, or a three-terminal element, such as an FET of which a bias is appropriately set, may also be used as the resistor.

The capacitor is an electronic component having a predetermined electric capacitance and being capable of storing charges. The capacitance of the capacitor may be capacitance between elements that are available as a capacitor device or between wirings, capacitance provided by interposing an insulating material between a pair of conductors, capacitance between two coaxial cables or two insulatively covered cables, or capacitance provided by other component. The light source and the light source driving circuit is basically serially connected directly, but may be serially connected through another electronic component.

According to the first aspect of the present invention, when the power supply is turned on, since the impedance of the capacitor is small compared with the impedance of the resistor, inrush current flows in the capacitor of the differentiation circuit, first. This inrush current then flows to the light source, which is serially connected to the light source driving circuit. At this time, voltage drop in the capacitor is negligibly small, and thus, the voltage generated by the inrush current is applied to the light source. This voltage is set so as to be greater than a threshold value for allowing the light source to emit light, and thus, the inrush current to the capacitor triggers light emission from the light source.

The inrush current to the capacitor occurs for an instant and ceases after the capacitor stores charges. As the inrush current to the capacitor decreases, a potential difference occurs between both ends of the resistor, which is connected to the capacitor in parallel. As a result, electric current starts to flow in the resistor instead of the inrush current to the capacitor. While the electric current having flowed in the resistor flows to the light source, voltage drop occurs in the resistor, and thus, the voltage applied to the light source becomes smaller than that having been applied due to the inrush current to the capacitor. This decreased voltage on the light source is smaller than a threshold value for the light emission due to adequately set various parameters. As a result, the electric current starting to flow to the resistor triggers cessation of light emission from the light source.

The various parameters (voltage of the power supply, resistance value and capacitance value of the differentiation circuit, and characteristics of the light source) are set so as to produce the above phenomenon. As a result, initial emission of pulsed light is performed in response to the generated inrush current to the capacitor, and subsequent emission of pulsed light associated with relaxation oscillation ceases in response to the generated electric current flowing in the resistor instead of the inrush current. These various parameters are determined through preliminarily experiments.

According to a second aspect of the present invention, in the first aspect of the present invention, the light emitting device may further include a temperature measuring part, and the voltage controlling part may control the voltage to be applied to the light source on the basis of the temperature measured by the temperature measuring part. A study conducted by the inventors of the present invention revealed that, regarding a specific light source, the relationship between temperature necessary for obtaining pulsed light with a specific waveform and voltage applied to the light source can be approximately determined. Based on this finding, in the second aspect of the present invention, the relationship between temperature necessary for obtaining a specific pulse waveform and applied voltage is obtained in advance, and voltage to be applied to the light source is determined on the basis of the temperature information measured by the temperature measuring part. Normally, characteristics can vary among light sources, and characteristics of other parts such as the resistor and the capacitor also can vary depending on precision and temperature. The structure according to the second aspect of the present invention performs compensation at a satisfactory accuracy, although the compensation is not perfect.

According to a third aspect of the present invention, in the first or the second aspect of the present invention, the voltage controlling part may control the voltage to be applied to the light source so that the pulsed light has a peak intensity value in a predetermined range. The structure according to the third aspect of the present invention measures the peak intensity of the pulsed light output from the light source and adjusts the voltage to be applied to the light source so that the peak intensity will fall within the predetermined range. The control for making the peak intensity fall within the predetermined range may also be performed for making the peak intensity be at a predetermined value.

According to a fourth aspect of the present invention, in any one of the first to the third aspects of the present invention, the voltage controlling part may control the voltage to be applied to the light source so that the pulsed light has a waveform satisfying a predetermined condition. The structure according to the fourth aspect of the present invention evaluates the waveform of the pulsed light output from the light source and varies the value of the voltage to be applied to the light source so that the waveform of the pulsed light will satisfy the predetermined condition. This function decreases the influences of temperature and precision of parts on the pulse waveform.

According to a fifth aspect of the present invention, in the fourth aspect of the present invention, the voltage controlling part may control the voltage to be applied to the light source so that the pulsed light has a waveform with a single peak. The pulsed light used in distance measurement desirably has a single-peak waveform. Nevertheless, temperature variation and precision of parts can cause the light emission circumstances and the light emission setting to deviate from ideal conditions and thus can cause relaxation oscillation, thereby generating pulsed light with multiple peaks instead of pulsed light with a single peak. In view of this, the structure according to the fifth aspect of the present invention is configured to control the voltage to be applied to the light source so that pulsed light with a single peak will be produced.

According to a sixth aspect of the present invention, in the fourth or the fifth aspect of the present invention, the voltage controlling part may control the voltage to be applied to the light source so as to generate pulsed light with symmetric waveform. The pulsed light used in distance measurement desirably has a waveform with good symmetry. Nevertheless, temperature variation and precision of parts can cause the light emission circumstances and the light emission setting to deviate from ideal conditions, and thus can cause loss of symmetry in the waveform of the pulsed light. In view of this, the structure according to the sixth aspect of the present invention evaluates the symmetry of the pulsed light by referring to a predetermined condition and controls the voltage to be applied to the light source in accordance with this result so as to prevent loss of symmetry in the waveform of the pulsed light.

According to a seventh aspect of the present invention, in any one of the first to the sixth aspects of the present invention, bias voltage to be applied to the switching element may be varied at the same time when the output voltage of the power supply varies. In a common technique, to turn on or turn off a power supply by using a three terminal switching element, such as a bipolar transistor or an FET, bias voltage is applied to a control electrode (base electrode or gate electrode) of the switching element to set a threshold value for turning on or turning off the power supply.

In the present invention, a serial circuit of the light source and the differentiation circuit is applied with voltage from the power supply, and the voltage is varied in accordance with conditions, thereby stably generating pulsed light. The switching element for turning on or turning off the power supply is serially connected between the serial circuit of the light source and the differentiation circuit, and the power supply circuit, to switch the connection between the serial circuit and the power supply circuit. Thus, in response to variation in the output voltage of the power supply, the voltage to be applied to the switching element (for example, the voltage between a source and a drain in an FET) also varies.

If the bias voltage is fixed, the threshold voltage relative to the ground potential varies in accordance with variation in the voltage applied to the transistor. Consequently, the switching element may switch on at any time or switch off at any time, or the switching element may not switch on or switch off at a necessary timing. The structure according to the seventh aspect of the present invention varies the bias voltage of the switching element at the same time when the voltage of the power supply varies, thereby controlling switching on or switching off at a desired timing regardless of the variation in the voltage of the power supply.

An eighth aspect of the present invention provides a distance measuring device including an illuminating part, a light receiving part, and a signal processing part. The illuminating part projects light of only initial oscillation of the relaxation oscillation from the light source to an object to be measured. The light receiving part receives light that is reflected from the object. The signal processing part calculates the distance to the object on the basis of an output signal from the light receiving part.

Effects of the Invention

The present invention reduces variation in the waveform of emitted pulsed light in a light emitting device due to various factors.

Figure 1:
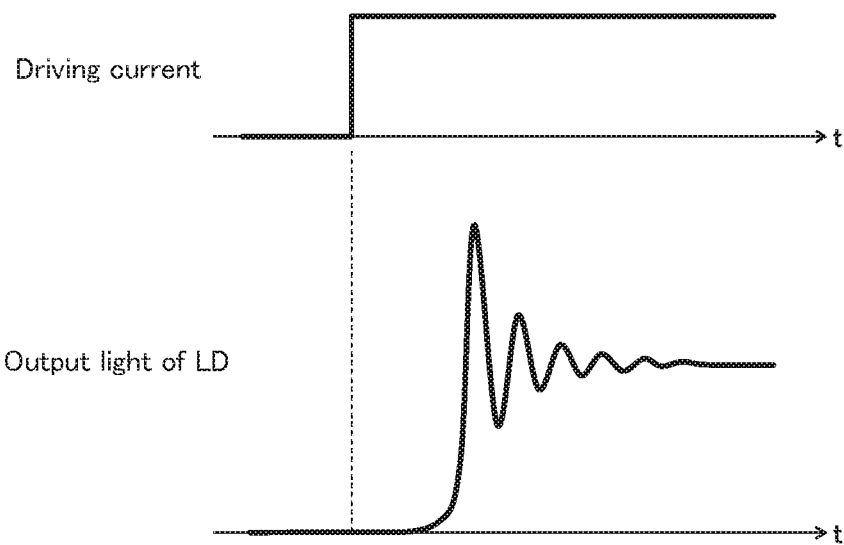
FIG. 1 is a diagram showing a relationship between driving current and intensity of emitted light from an LD.

EXPLANATION OF REFERENCE NUMERALS 100 denotes a light emitting device, 101 denotes a light source (LD), 102 denotes a differentiation circuit, 102a denotes a resistor, 102b denotes a capacitor, 103 denotes a switch (FET), 104 denotes a light source driving circuit, 111 denotes a semitransparent mirror, 112 denotes a mirror, and 500 denotes a distance measuring device.

DETAILED DESCRIPTION OF PREFERRED EMBODIMENTS

1. First Embodiment

Structure

Figure 3A:
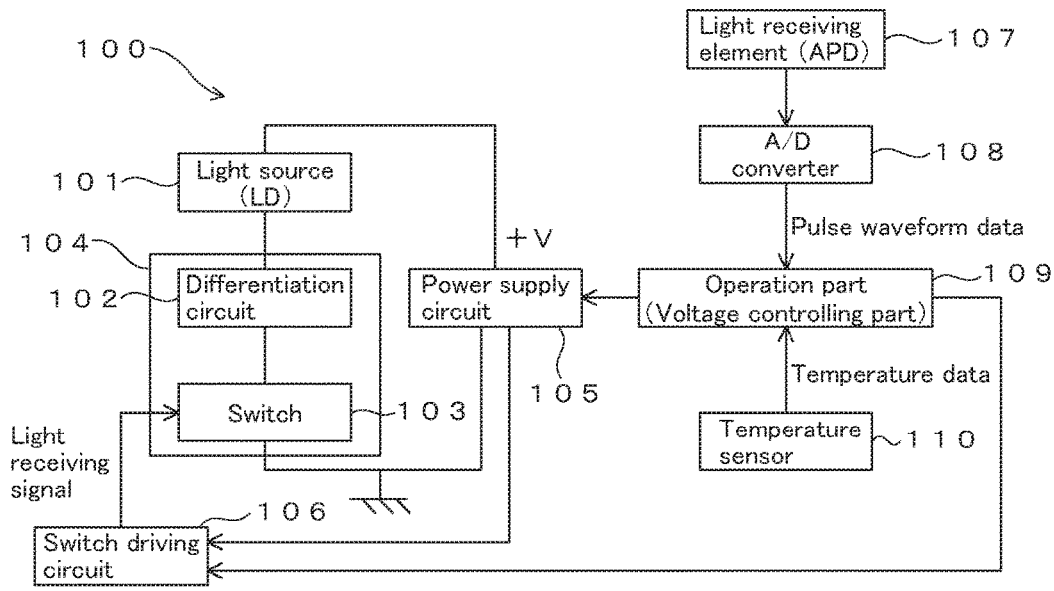
FIGS. 3A and 3B are block diagrams of a light emitting device of an embodiment.
Figure 3B:
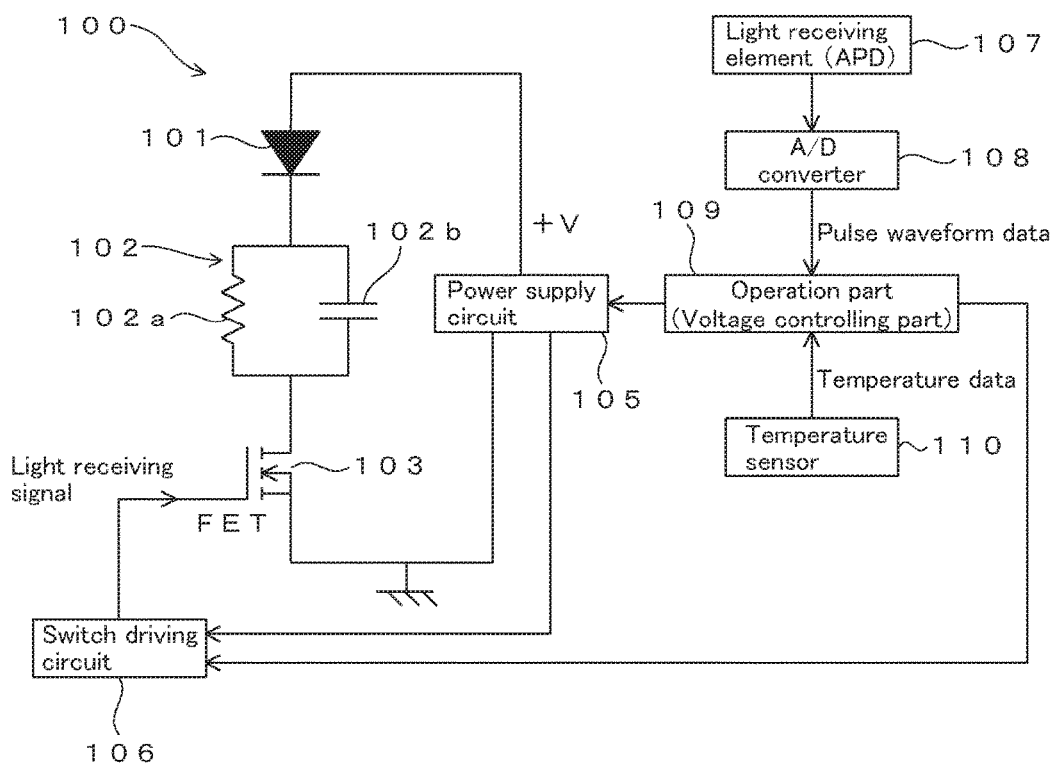
Figure 4:
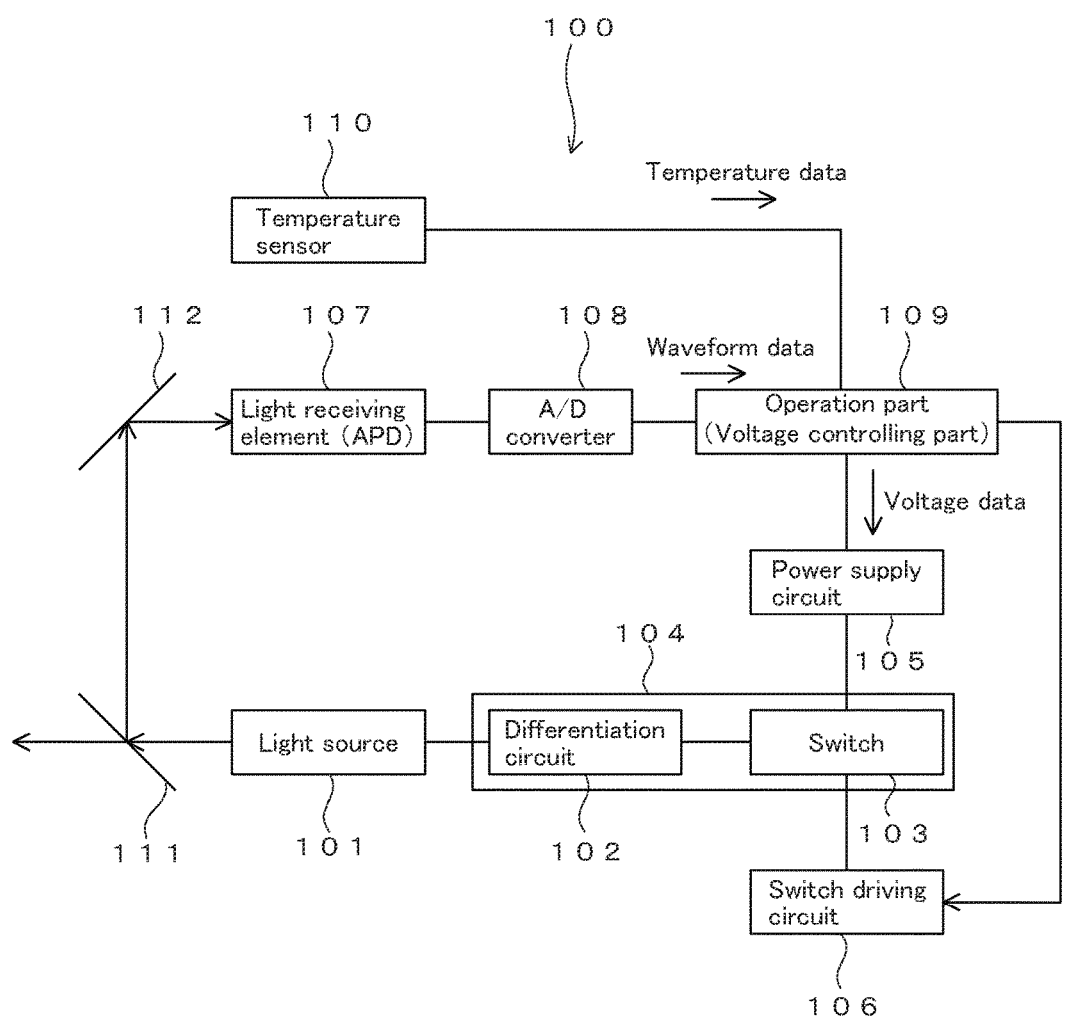
FIG. 4 is a block diagram of an embodiment.

FIG. 3A shows a block diagram of a light emitting device of an embodiment, and FIG. 3B is a block diagram describing a circuit of a part of the light emitting device shown in FIG. 3A. FIG. 4 shows a configuration of a light emitting device including an optical system. FIGS. 3A, 3B, and 4 show a light emitting device 100. The light emitting device 100 includes a light source 101, a differentiation circuit 102, and a switch 103, which are connected in series. The differentiation circuit 102 and the switch 103, which are connected in series, constitute a light source driving circuit 104. The circuit of the light source 101 and the light source driving circuit 104 in serial connection has both ends to which a power-supply voltage V can be applied from a power supply circuit 105. Although FIGS. 3A and 3B show an example of applying a positive voltage, the light source side may be set to have a ground potential, and the switching side may be set to have a negative potential, to apply a negative voltage.

The light source 101 is an LD. The differentiation circuit 102 is made by connecting a resistor R 102a and a capacitor C 102b in parallel and allows pulse-like current (differential current) to flow therein when applied with a voltage by switching on the switch 103. The switch 103 is an FET and is switched on or switched off in response to a driving signal from a switch driving circuit 106. When the switch 103 is switched on, the serial circuit of the light source 101 and the differentiation circuit 102 is applied with a voltage V from the power supply circuit 105. When the switch 103 is switched off, the serial circuit of the light source 101 and the differentiation circuit 102 is not applied with the voltage V. Although using an FET here, the switch 103 may also use a bipolar transistor or an IC of a switch of various types. The power supply circuit 105 is configured so that its output voltage is variable.

The light emitting device 100 includes a light receiving element 107, an A/D converter 108, an operation part 109, and a temperature sensor 110. The light receiving element 107 receives a portion of light emitted from the light source 101 and converts it into an electric signal. The light receiving element 107 is a photoelectric transducer, such as an avalanche photodiode (APD). The A/D converter 108 converts output from the light receiving element 107 into a digital signal. The digital signal is waveform data containing information relating to the waveform of the pulsed light, which is emitted from the light source 101 and is detected by the light receiving element 107. The digital signal output from the A/D converter 108 is transmitted to the operation part 109.

The operation part 109 is hardware that functions as a computer, and the operation part 109 includes a CPU, a RAM, a ROM, other arithmetic circuit, a storage circuit, and various types of interface circuits, or includes an FPGA that constructs them. The operation part 109 performs processing as described below.
(1) Determine timing of emitting light.
(2) Measure a waveform of pulsed light output (emitted) from the light source 101, on the basis of the output from the A/D converter 108.
(3) Determine an output voltage of the power supply circuit 105 on the basis of the measured waveform of the pulsed light.
(4) Determine the output voltage of the power supply circuit 105 on the basis of the temperature measured by the temperature sensor 110.
(5) Control the power supply circuit 105.

The temperature sensor 110 measures the temperature in the light emitting device 100 and transmits the data of the measured temperature to the operation part 109. The temperature sensor 110 is positioned so as to measure the temperature of the light source 101 (LD) with high accuracy because the light source 101 is most susceptible to temperature.

As shown in FIG. 4, pulsed light emitted from the light source 101 is partially reflected by a semitransparent mirror 111 to a reflective mirror 112 and enters the light receiving element 107. The semitransparent mirror 111, for example, reflects light having quantity of several percents of incident light and transmits the remnant. The reflective mirror 112 is an ordinary reflecting mirror. Under the configuration shown in FIG. 4, the light emitting device 100 detects a portion of light emitted from itself by using the light receiving element 107 and takes it in the inside.

The switch driving circuit 106 receives a light receiving signal from the operation part 109 and outputs a switch driving voltage (for example, switch driving voltage shown in FIG. 10) for making the switch 103 switch on or switch off. Regarding circuit constants of the differentiation circuit 102, for example, the power-supply voltage is 5V, the resistance value of the resistor 102a is 200 ohm, the capacitance of the capacitor 102b is 22 pF, and a rectangular wave with a frequency of approximately several tens of MHz at most is used as a light receiving signal for determining the timing of switching on or switching off.
Operation of Differentiation Circuit When the switch 103 is switched off, and there is no electric conduction between source and drain, the voltage V is not applied to the light source 101 and to the differentiation circuit 102, and the light source 101 does not emit light.

When the switch 103 is switched on, the voltage V is applied, which allows electric charges to flow in the capacitor 102b, resulting in generation of inrush current that will flow to the light source 101 as driving current. The driving current makes the light source 101 emit light.

As the electric charges accumulate in the capacitor 102b, the inrush current suddenly decreases. According to the decrease of the inrush current to the capacitor 102b, electric current flowing into the resistor 102b increases. When the capacitor 102b is completely charged with electric charge, the electric current flowing into the capacitor 102b stops, and the value of the electric current flowing in the resistor 102a and the value of the electric current flowing in the light source 101 become the same.

Figure 2:
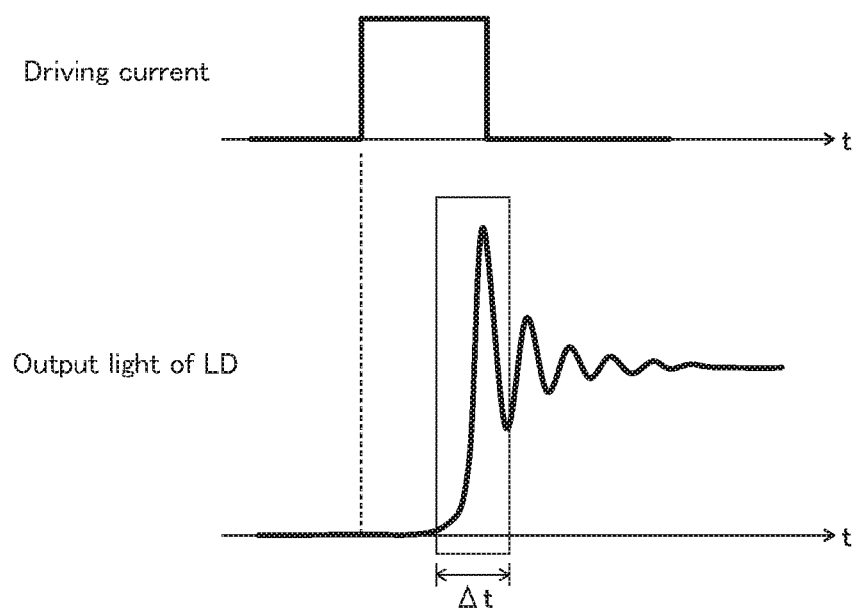
FIG. 2 is a diagram showing a relationship between driving current and intensity of emitted light from an LD.

Here, the value of the power-supply voltage (V) and the values of the capacitor 102b and the resistor 102a are set so that the charging period (inrush-current flowing period) of the capacitor 102b will be approximately the same as the period Δt in FIG. 2. When the inrush current stops flowing into the capacitor 102b, the voltage drops at the resistor 102a, thereby decreasing the voltage applied to the light source 101. The value of the resistor 102a and the other parameters are selected so that the light source 101 will stop emitting light by this decrease in the voltage. From another viewpoint, when the inrush current stops flowing into the capacitor 102b, electric current flows in the resistor 102a, whereby the resistor 102a controls (limits) electric current flowing into the light source 101. That is, from this point of view, the value of the resistor 102a and the other parameters are set so that the value of LD current flowing in the light source 101 will be less than a threshold value for light emission by this electric current control.

In this configuration, with appropriately set parameters, the light source 101 emits light while the capacitor 102b is charged, and immediately after that, voltage drops or electric current is limited at the resistor 102a, followed by decrease in the voltage applied to the light source 101 or in the value of electric current flowing in the light source 101, whereby the light source 101 stops emitting light. As a result, the generation of subsequent relaxation oscillation, as shown in FIGS. 1 and 2, is suppressed, and only the initial pulse of light during the period Δt is emitted.

Figure 5:
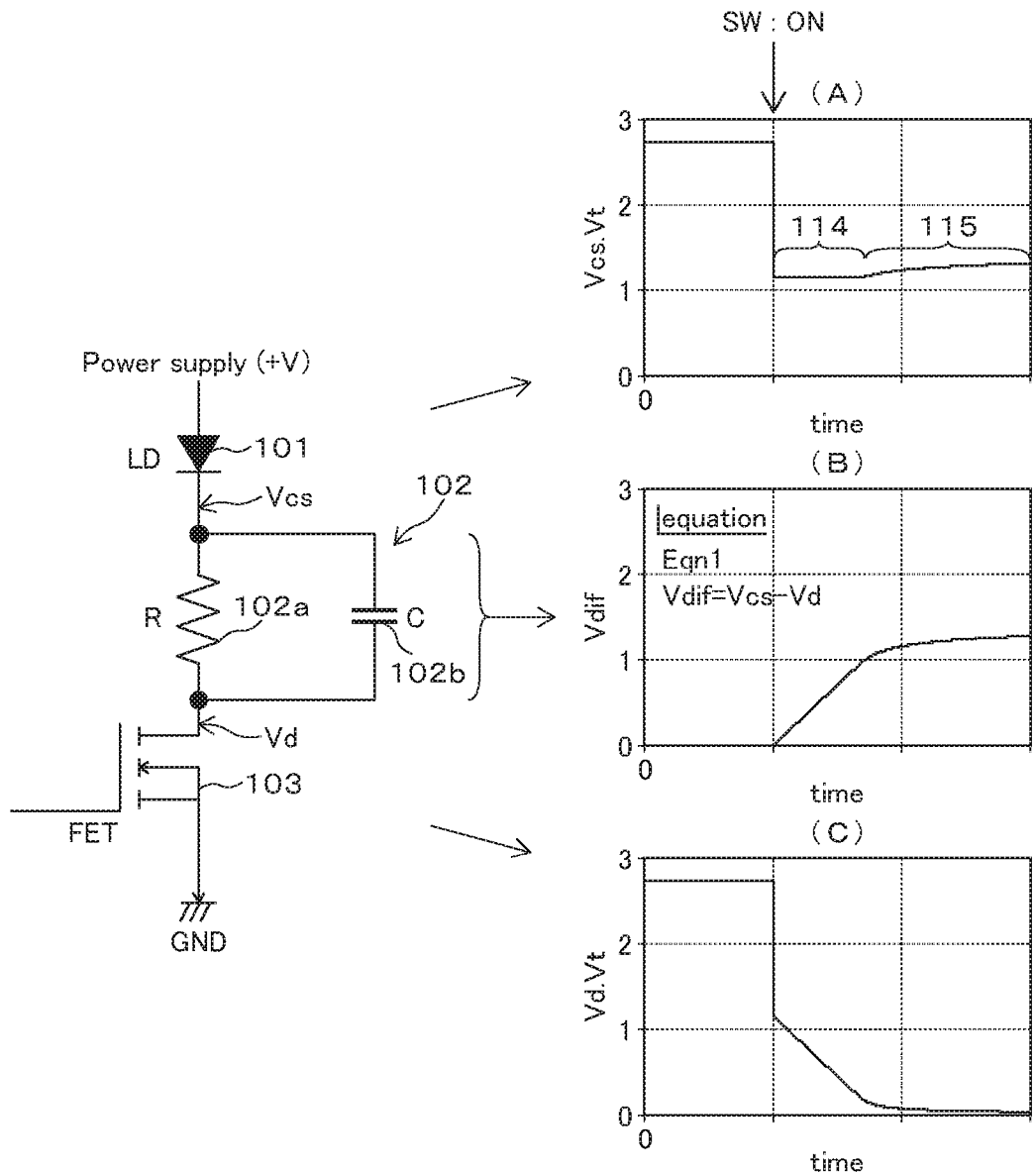
FIG. 5 is an explanatory diagram for explaining a voltage of each part in an embodiment in operation.

The above operation will be described in more detail with reference to the drawings hereinafter. FIG. 5 shows graphs (A) to (C) showing changes in voltage applied at each part. FIG. 5 shows an example of using a positive power supply. The graph (A) shows a voltage Vcs in the light source 101 side of the differentiation circuit 102. The voltage of V-Vcs is the voltage to be applied to the light source 101. The graph (B) shows a voltage to be applied to the differentiation circuit 102, that is, a voltage Vdif to be applied to the resistor 102a and the capacitor 102b. The graph (C) shows a voltage Vd to be applied between the source and the drain of the switch (FET) 103.

After the switch 103 is switched on, the capacitor 102b starts to charge, and inrush current flows in the capacitor 102b. In the first stage, the capacitor 102b is electrically shorted, and flowing electric current primarily includes the inrush current into the capacitor 102b. The generated inrush current flowing into the capacitor 102b also flows to the light source as driving current, thereby allowing the light source 101 to emit light.

As the capacitor 102b is gradually charged, the resistance value of the capacitor 102b gradually increases, which leads to increase in electric current flowing in the resistor 102a. Meanwhile, the voltage Vdif applied to the differentiation circuit 102 gradually increases. This is because the voltage starts to drop at the resistor 102b.

When the switch 103 is switched off, both electrodes of the capacitor 102a are shorted by the resistor 102b and have the same potential, that is, Vdif=0 V. While the inrush current flows in the capacitor 102b, which is a period indicated by the reference symbol 114 in the graph (A) in FIG. 5, electric charges gradually accumulate in the capacitor 102b due to inflow of the electric current, followed by generating of a potential difference between the two electrodes. Thus, the potential at the position of Vd is gradually decreased, and the value of Vd fluctuates as shown in the graph (C) in FIG. 5.

As the electric charges gradually accumulate in the capacitor 102b due to inflow of the inrush current to the capacitor 102b, the inrush current gradually decreases, whereas the current flowing in the resistor 102b increases correspondingly. Consequently, the voltage drops at the resistor 102a, and the voltage applied to the light source 101 decreases. In more detail, the influence of the voltage drop occurring at the resistor 102a increases with respect to the power-supply voltage V, and the voltage applied to the light source 101 decreases accordingly. That is, the voltage drop occurring at the resistor 102a increases the value of Vcs (refer to the period 115 in the graph (A) shown in FIG. 5), whereas the voltage of V−Vcs applied to the light source 101 decreases correspondingly.

The resistance value of the resistor 102a and the other parameters are set so that the voltage (V−Vcs) applied to the light source 101 will be decreased to be less than the threshold value for the light emission. Thus, the light source 101 emits light during the period 114 shown in the graph (A) in FIG. 5 and stops emitting light during the period 115 shown in the graph (A) in FIG. 5. Here, the values of the resistor 102a and the capacitor 102b of the differentiation circuit 102 are adjusted or set so that the period 114 approximately corresponds to the period Δt shown in FIG. 2, to make only one pulse of light at the initial stage be emitted.

Under the condition in the period 115, when the switch 103 is switched off, the electric current stops flowing into the light source 101, and the electric charges charged in the capacitor 102b flow in the resistor 102a and are consumed thereat. Thus, the condition returns to the initial condition in which the switch 103 is switched off.

Subsequently, the switch 103 is switched on again to repeat the above-described operation, thereby allowing the light source 101 to emit a second pulse of light. Such switching on and switching off of the switch 103 is repeated to make the light source 101 emit a pulse of light repeatedly.
Setting Values of CR A principle for setting the values of the capacitor C (102b) and the resistor R (102a) is described as follows.
(1) The minimum value of C: Capacitance value by which electric current flows in the LD at not less than the threshold current value for oscillation.
If it is too small, the LD does not oscillate.
(2) The maximum value of C: Capacitance value by which electric current flows for generating only an initial pulse in the relaxation oscillation and suppressing subsequent pulses (depending on the value of R).
If it is too large, continuous relaxation oscillation occurs.
(3) The minimum value of R: Resistance value by which the value of the LD current is the same as the threshold current value for oscillation.
If it is too small, continuous relaxation oscillation occurs.
(4) The maximum value of R: Resistance value by which a difference between the voltage dropped at the R and the power-supply voltage is the same as the value of the forward direction voltage of the LD (depending on the value of C).
If it is too large, discharge is not completed before generation of the next pulse.

The peak value of the pulsed light and the values of C and R have approximately the following relationships.
  To increase the intensity of the light pulse, the value of C is increased, while the value of R is decreased.
  To decrease the intensity of the light pulse, the value of C is decreased, while the value of R is increased.
Note that the values of C and R may not be uniquely determined because there is a correlation therebetween. The values of C and R must be selected also in consideration of the effect of suppressing the subsequent relaxation oscillation.
Influences of Temperature and Precision of Parts The setting of CR matches the characteristics of the LD for obtaining a specific pulse waveform in a narrow variation range. Specifically, even though an optimal matching setting is found by using test products, variation in the characteristics of the parts in mass-produced items may result in variations in the waveforms of the pulsed light emitted from the light sources 101. LDs having the same model number but having different production lot numbers may have different characteristics and thus may generate different pulse waveforms even under the same light emission circumstances. In particular, temperature variation causes variation in characteristics of each part, especially the light source (LD) 101, and these variations greatly affect the pulse waveform.

Figure 6:
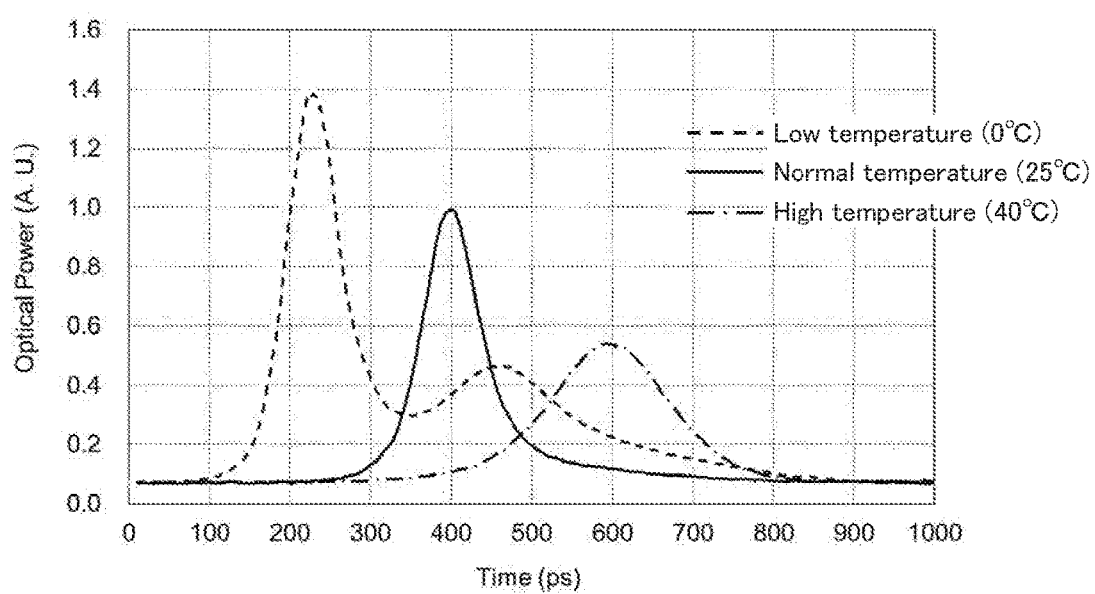
FIG. 6 is a characteristic diagram showing a waveform of emitted light from an LD at each temperature.
Figure 7A:
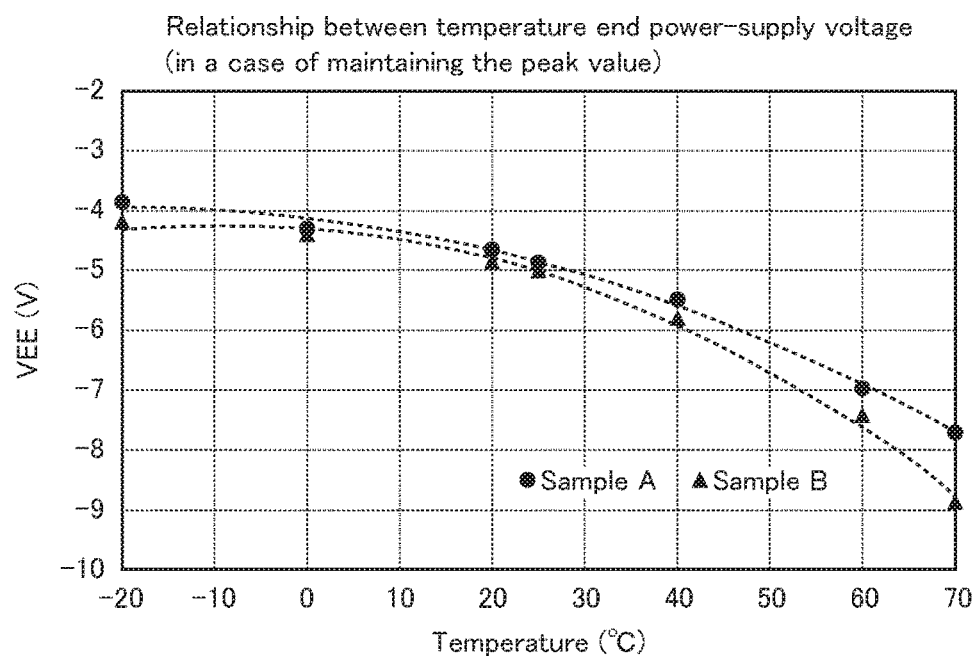
FIG. 7A is a graph showing a relationship between temperature and applied voltage.
Figure 7B:
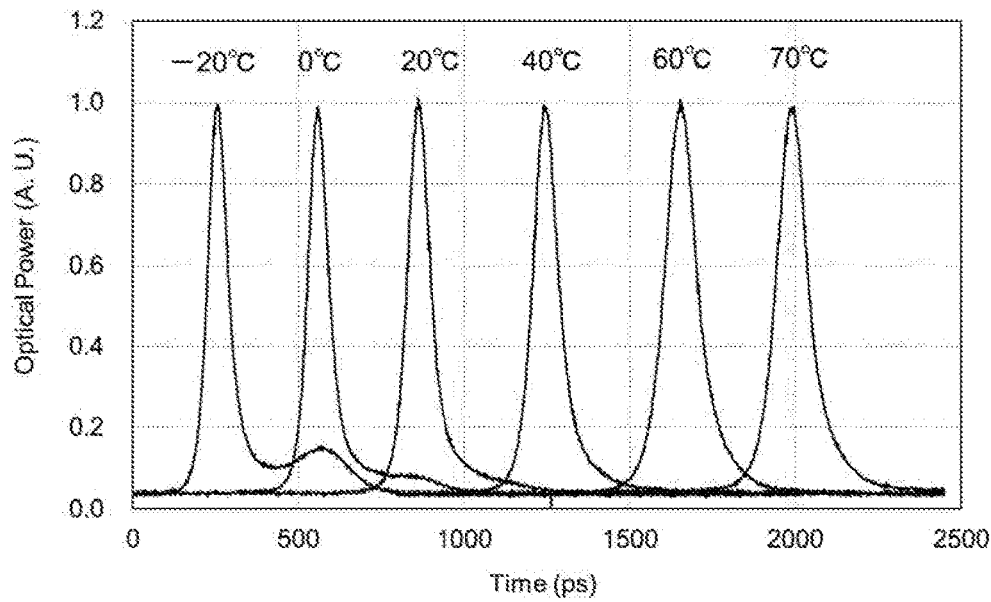
FIG. 7B is a waveform diagram showing a waveform of emitted light at each temperature, when light was emitted so that the peak value of the intensity thereof would be constant.

FIG. 6 shows differences in the waveforms of pulsed light when the temperatures of the LD and the light source driving circuit are varied. As shown in FIG. 6, when the temperatures of the LD differ, the waveforms of the emitted pulsed light differ from each other. The waveform of the pulsed light emitted at a low temperature (0° C.) includes a second pulse of the relaxation oscillation. FIG. 7A shows a relationship between temperature and power-supply voltage when a power-supply voltage VEE is varied so that the peak value of the emitted light will be constant regardless of variation in temperature of the LD. FIG. 7B shows the differences of the waveforms in the case shown in FIG. 7A.
Method of Controlling Waveform of Emitted Pulsed Light As shown in FIG. 6, even when the light emission setting is the same, the waveform of the emitted pulsed light varies according to temperature. The waveform and the peak value of the pulsed light emitted from the light source 101 vary according to the voltage applied to the light source for making the light source emit light. Specifically, as shown in FIG. 7B, even when the temperature varies, power-supply voltage adjustment enables making the peak values of the output waveforms be approximately the same while the similarity between the output waveforms is slightly degraded. The above-described phenomena are used to appropriately vary the voltage applied to the light source 101 in accordance with the variation in the temperature. Consequently, the following effects are obtained.
(1) The pulse waveforms will have different peak values but have similar shapes.
(2) The pulse waveforms will have different shapes but have the same peak values.
(3) The pulse waveforms will have similar peak values and similar shapes within predetermined degrees.

The above effect (3) is obtained by combining the effects (1) and (2) to achieve uniformity of the peak values and similarity of the waveforms. The uniformity of the peak values may be preferentially achieved in considering the similarity of the shapes of the waveforms, or alternatively, the similarity of the shapes of the waveforms may be preferentially achieved in considering the uniformity of the peak values. The symmetry of the pulse waveform can be maintained by the control of adjusting the voltage to be applied to the light source 101.

The above-described processing relating to the control of the waveform of the emitted pulsed light is performed by the operation part 109 shown in FIG. 3. A program for determining the processing procedure to be executed by the operation part 109 is stored in a storage part of the operation part 109, and it is read by an appropriate storage area and is executed. Alternatively, the program may be stored in an appropriate storage medium and be provided therefrom. Here, the voltage to be applied to the light source 101 is varied by varying the output voltage of the power supply circuit 105. In some cases, the voltage to be applied to the light source 101 may be varied by using a variable resistive element arranged in the circuit, and voltage drop is made to occur at the variable resistive element to adjust the resistance value of the variable resistive element.

The waveform of the emitted pulsed light is compensated as described below. First, the light source 101 is made to emit pulsed light. The emitted pulsed light is detected by the light receiving element 107, and data of the waveform of this emitted pulsed light is output from the light receiving element 107. The operation part 109 judges whether the waveform of this emitted pulsed light satisfies a predetermined condition; if not, the operation part 109 varies the output voltage (power-supply voltage) of the power supply circuit 105 so that the waveform of the emitted pulsed light will satisfy the predetermined condition, and emission of pulsed light is performed again. This cycle of measuring the waveform of emitted light, judging the waveform, varying the power-supply voltage, and performing emission of pulsed light is repeated until the waveform satisfies the predetermined condition. This operation enables emission of light while compensating variation in the waveform of the emitted light due to variation in temperature and variation in characteristics of parts.

Exemplary embodiments of methods of adjusting the power-supply voltage are described below.
(1) Adjust the power-supply voltage so that the peak power will be maintained at a predetermined value.
(2) Adjust the power-supply voltage so that the emitted pulsed light will have a single peak.
(3) Adjust the power-supply voltage so that the emitted pulsed light will have a symmetric waveform.
(4) Adjust the power-supply voltage in accordance with the measured temperature.

Figure 15:
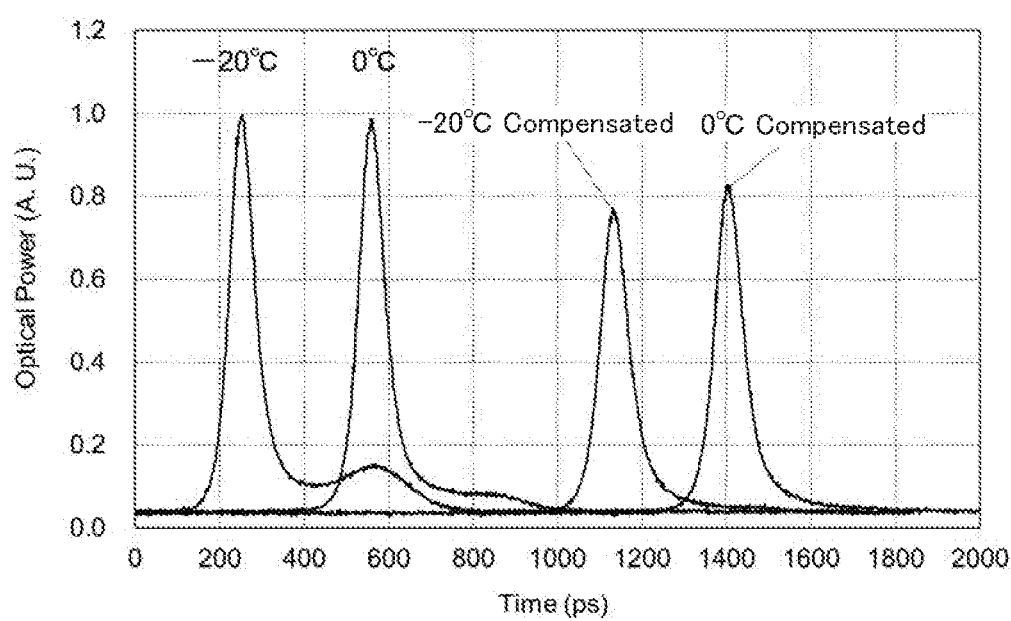
FIG. 15 is a waveform diagram showing variation in each waveform when the peak value of a pulse waveform of emitted light was reduced.

FIG. 15 shows compensation examples of lowering the power-supply voltage to lower peak values of waveforms, thereby suppressing generation of relaxation oscillation and clearly producing a single peak in the pulse waveforms. In the case of using the method (4) for adjusting the power-supply voltage in accordance with temperature, a margin of error may occur due to variation in characteristics of parts, elapse of time, and other factors, but a similar pulse waveform is reproduced.

In practical operation, one or multiple of the above methods (1) to (3) are used, and moreover, the method (4) is also preliminarily performed. Specifically, the pulse waveform of the emitted light is roughly compensated for by the method (4) first, and then the pulse waveform of the emitted light is precisely compensated for by one or more of the methods (1) to (3). Specific procedures for compensation will be described in detail later.

Adjustment of Power-Supply Voltage

Figure 8A:
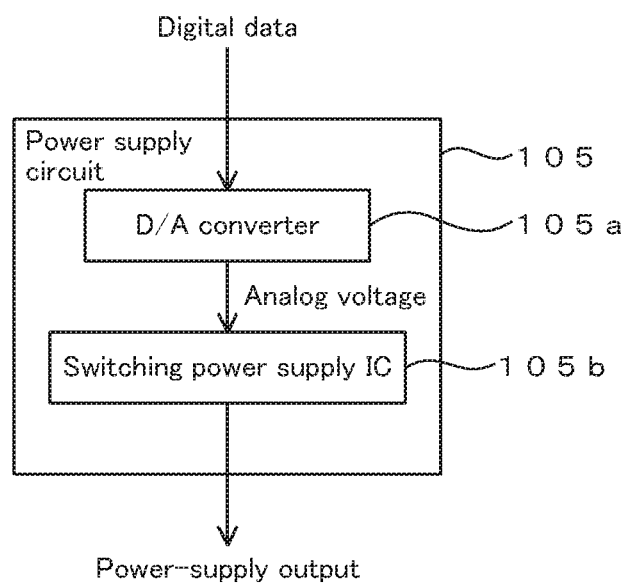
FIGS. 8A and 8B are block diagrams of power supply circuits of embodiments.

Hereinafter, a configuration capable of varying output voltage of the power supply circuit 105 is described. FIG. 8A shows a first configuration in which the operation part 109 (refer to FIG. 3) outputs digital data for determining voltage to the power supply circuit 105. This power supply circuit 105 includes a D/A converter 105*a* and a switching power supply IC 105*b* capable of variably controlling the output voltage by control voltage.

The digital data output from the operation part 109 for determining voltage is converted into an analog voltage signal by the D/A converter 105*a*, and the analog voltage signal is input to the switching power supply IC 105*b*. The switching power supply IC 105*b* outputs an output voltage corresponding to the analog voltage (control voltage) output from the D/A converter 105*a*. Thus, the voltage determined by the operation part 109 is output from the power supply circuit 105.

Figure 8B:
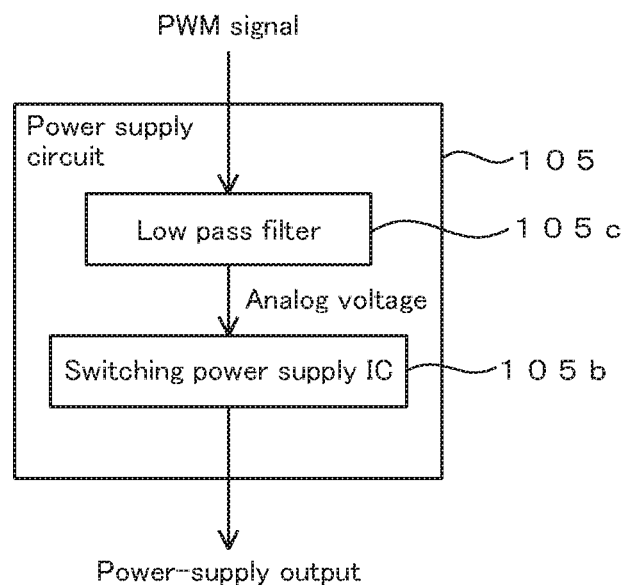

FIG. 8B shows another configuration in which the operation part 109 (refer to FIG. 3) outputs a PWM signal corresponding to the determined voltage. In this case, the PWM signal is set to have a pulse width corresponding to the determined voltage, which is determined by the operation part 109 and is to be finally output from the power supply circuit 105. This power supply circuit 105 includes a low pass filter 105*c* and a switching power supply IC 105*b*.

The PWM signal output from the operation part 109 is converted into an analog voltage by the low pass filter 105*c*, and then, an output voltage corresponding to the analog voltage is output from the switching power supply IC 105*b*. Thus, also in the case shown in FIG. 8B, the voltage determined by the operation part 109 is output from the power supply circuit 105.

Switch Driving Circuit

Figure 9:
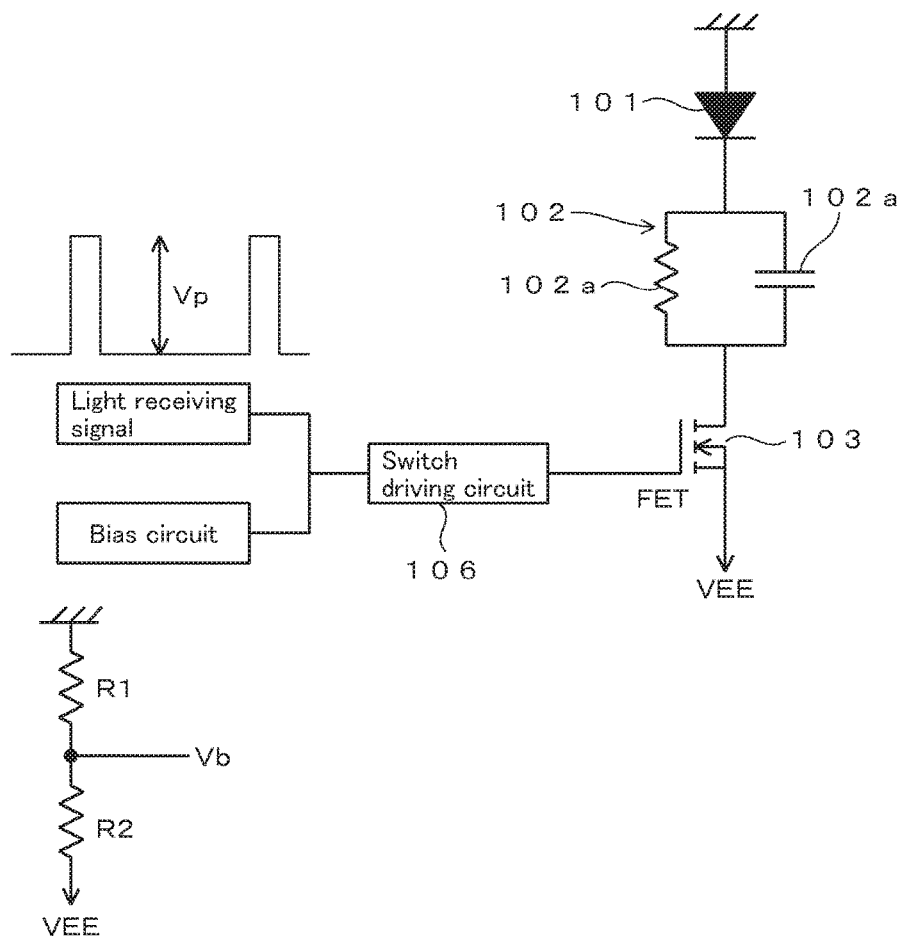
FIG. 9 is a block diagram showing a structure for determining the bias of an FET constituting a switch.

As shown in FIG. 9, the switch driving circuit 106 for driving the FET of the switch 103 receives a switch driving voltage for controlling emission of the light source 101 and is supplied with a bias voltage for determining the operation condition of the FET, from the bias circuit. The bias circuit generates a bias voltage Vb by dividing the power-supply voltage VEE with resistors R1 and R2. The bias voltage Vb is applied to the gate of the FET as the bias voltage. In this configuration, the bias voltage Vb varies in conjunction with the variation in the power-supply voltage VEE.

Figure 10:
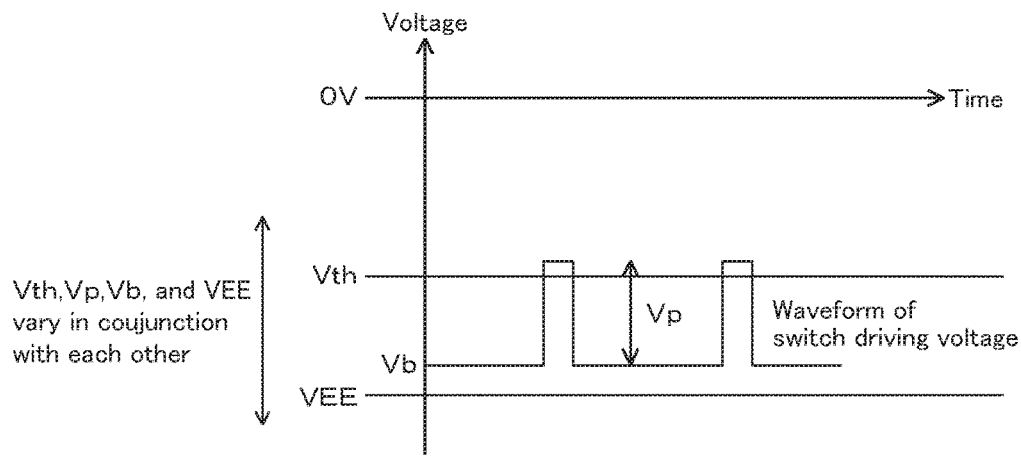
FIG. 10 is an explanatory diagram for explaining a bias voltage.

FIG. 10 shows relationships between the switch driving voltage (waveform of the driving signal applied to the gate electrode of the FET), Vth (threshold voltage of the FET), Vb (the bias voltage applied to the gate electrode of the FET), and VEE (power-supply voltage), in the configuration shown in FIG. 9. FIG. 10 shows an example of using a negative power supply.

Here, the switch driving voltage has a peak value Vp that is set based on Vb to be greater than the difference between Vth and Vb. Under this setting condition, the FET is switched on during the period while the switch driving voltage with the peak value Vp is applied to the gate and is switched off during other periods. In the case shown in FIG. 10, the FET is repeatedly switched on or switched off in accordance with the waveform of the switch driving voltage.

In the configuration shown in FIG. 9, the bias voltage Vb varies in conjunction with the variation in the power-supply voltage VEE. Naturally, the value peak Vp also varies in conjunction with the variation in the bias voltage Vb. Also, since the threshold voltage Vth depends on the power-supply voltage VEE, the threshold voltage Vth varies with variation in the power-supply voltage VEE. Thus, in the configuration shown in FIG. 9, the bias voltage Vb, the peak value Vp, and the threshold voltage Vth, vary in conjunction with the variation in the power-supply voltage VEE. Meanwhile, the relative relationships among the bias voltage Vb, the peak value Vp, and the threshold voltage Vth do not change. That is, even when the power-supply voltage VEE varies, the relative relationships among the bias voltage Vb, the peak value Vp, and the threshold voltage Vth are maintained.

Consequently, even when the power-supply voltage VEE varies, the operation conditions do not change, and the FET is made to switch on or switch off by the switch driving voltage at a desired timing.

Figure 11A:
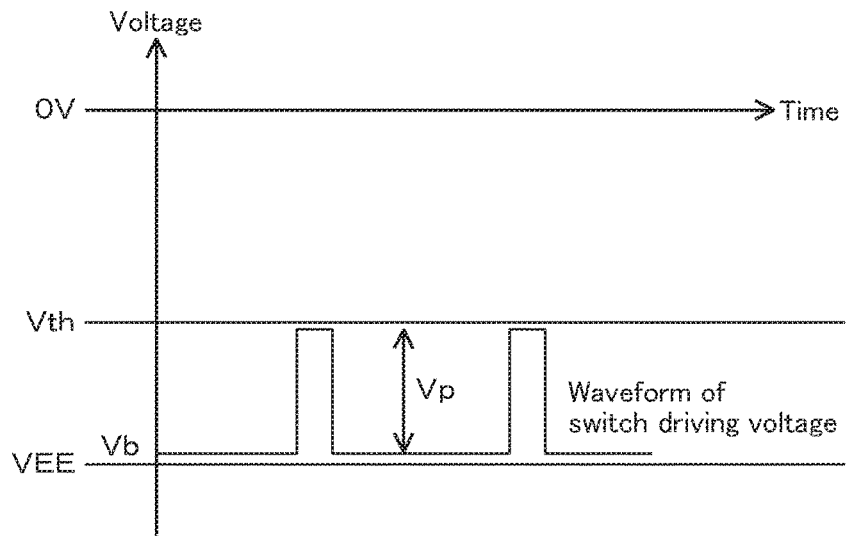
FIGS. 11A and 11B are explanatory diagrams for explaining a bias voltage.
Figure 11B:
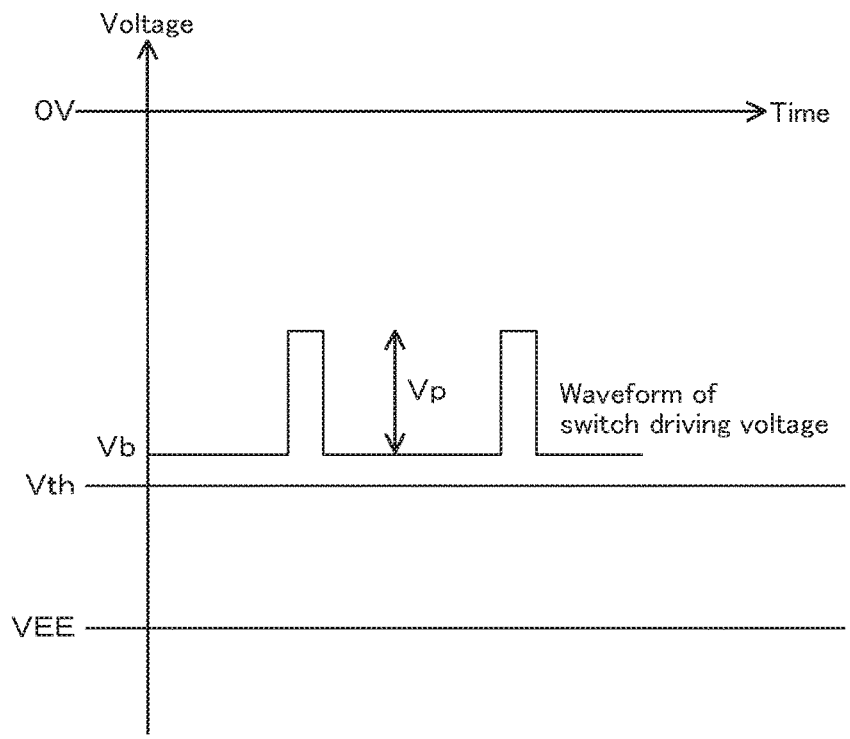

If a bias voltage Vb having a constant value independent of the power-supply voltage VEE is used instead of generating the bias voltage Vb by dividing the power-supply voltage VEE as shown in FIG. 9, the following inconvenience occurs. In this case, the values of the bias voltage Vb and the peak value Vp are fixed and do not vary with the variation in the power-supply voltage VEE. However, the value of the threshold voltage Vth varies with the variation in the power-supply voltage VEE. As a result, the peak value Vp becomes less than the threshold value Vth as shown in FIG. 11A, and the FET does not switch on at a necessary timing, or the bias voltage Vb becomes greater than the threshold value Vth as shown in FIG. 11B, and the FET is switched on at any time.

If the FET (switch 103) does not switch on, the light source 101 does not emit light. If the FET is switched on at any time, the light source 101 may continuously emit light. Thus, the bias voltage Vb that does not vary with the power-supply voltage VEE can interfere with controlling of emission of light.

Example of Operation

Hereinafter, an exemplary processing procedure will be described. The processing described below is executed by the operation part 109. The program for determining the processing procedure described below is stored in an appropriate storage area or a storage medium, and it is executed by the operation part 109.

Processing for determining the output voltage of the power supply 105 shown in FIG. 3 (hereinafter called "compensation processing") is described below. The compensation processing is performed at one or more of timings when the power supply is turned on, when a predetermined time elapses, when a user instructs to perform the compensation processing, and when temperature variation with a predetermined degree is measured while the power supply is turned on.

Before the compensation processing is started, preliminarily testing is performed by using the same product of the LD, which is used in the light source 101, to obtain a relationship (refer to FIG. 7A) between the value and the temperature of the applied voltage, which is necessary for obtaining a target peak value. This data is stored in an appropriate storage means, such as the storage area of the operation part 109.

Figure 12:
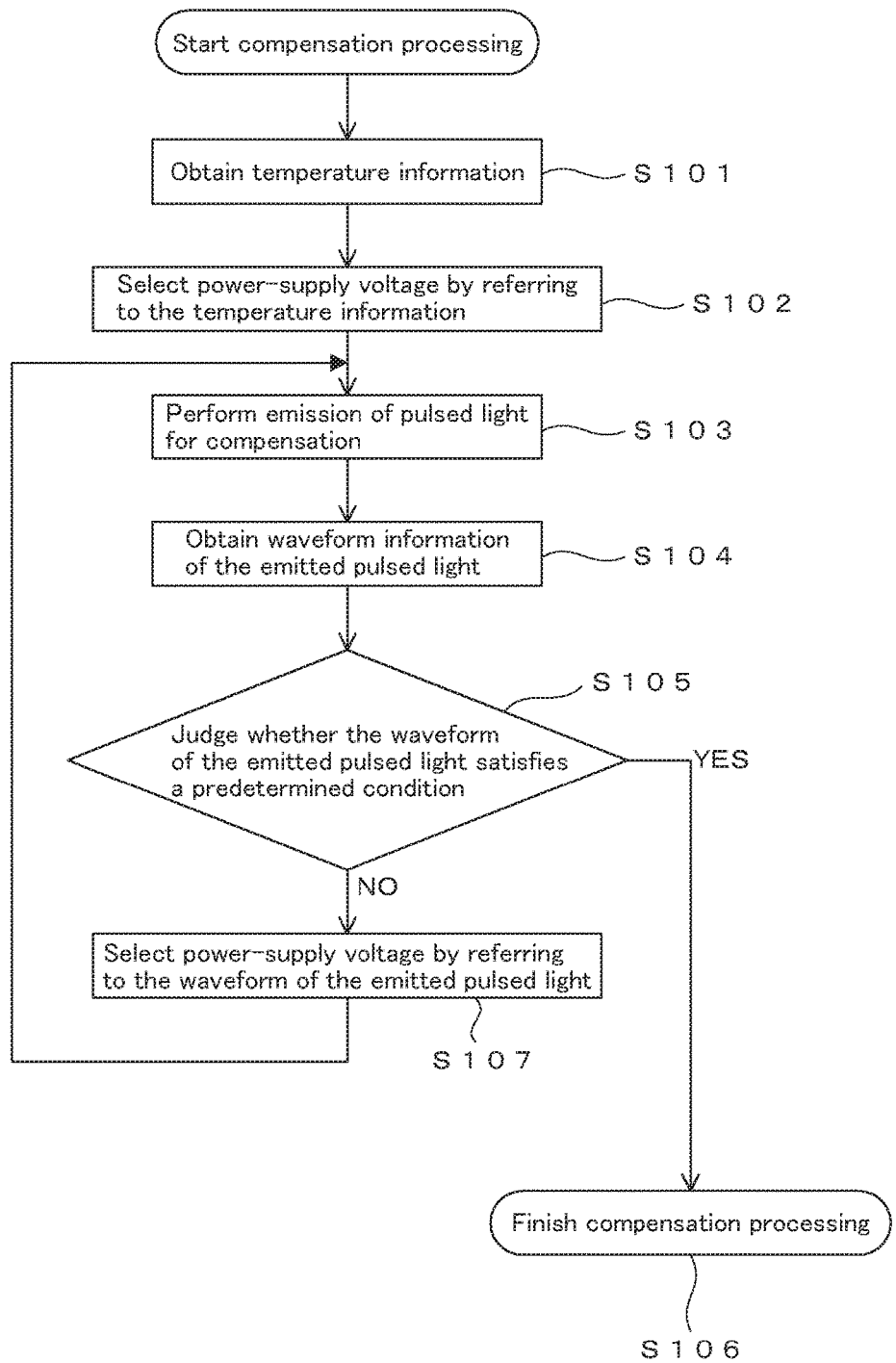
FIG. 12 is a flow chart showing an example of a processing procedure.

FIG. 12 shows an example of a procedure of the compensation processing. After the processing is started, first, information of temperature measured by the temperature sensor 110 is obtained (step S101). Then, a power-supply voltage corresponding to the temperature obtained in step S101 is selected by referring to the preliminarily obtained relationship between the value and the temperature of the power-supply voltage, which is necessary for obtaining a target peak value (step S102). The selected power-supply voltage is output from the power supply circuit 105, thereby making the light source 101 emit pulsed light (step S103). The light emission in step S103 is performed to evaluate the waveform of the emitted pulsed light by way of testing. In this step, light with a single pulse is emitted according to the principle described in relation to FIG. 5.

After the light is emitted, a portion of the light is received by the light receiving element 107 through the mechanism as shown in FIG. 4. At this time, the light receiving element 107 outputs information relating to the waveform of the emitted pulsed light to the operation part 109 (step S104). In this step, to increase the precision, emission of pulsed light is consecutively performed multiple times, and data of each emitted pulsed light is obtained.

Hereinafter, information relating to the waveform of the emitted pulsed light is described. The emitted pulsed light has a width (width on the time axis) of approximately 100 to 300 ps (refer to FIG. 6). However, a typical A/D converter has a sampling frequency of approximately several GHz at most. For example, when an A/D converter has a sampling frequency of 1 GHz, the sampling interval is $1/1 \times 10^9$ s=1000 ps. For this reason, to measure the pulse waveforms of the emitted light with high accuracy, the pulse waveforms are measured by using one or both of the following methods: a time interleave method in which the sampling interval is shortened by differentiating the phases of emitted pulsed light and using multiple A/D converters, and a sampling method in which multiple emitted pulsed lights are consecutively sampled at different timings.

For example, in an ideal condition without influences of noise and other factors, using four A/D converters each having a sampling interval of 500 ps in the time interleave method enables sampling at an interval of 125 ps. Moreover, this sampling may be intermittently performed at each 10 pulses at different timings, whereby the time resolution is made to be ¹⁄₁₀, that is, 12.5 ps. In this case, 20 sampling points are obtained in 250 ps width, and thus, the waveforms of the emitted pulsed light are measured at high accuracy.

The processing for obtaining data relating to the waveform of the emitted pulsed light as shown in FIG. 6 is thus performed in step S104. Thereafter, whether the pulse waveform of the emitted light satisfies the predetermined condition is judged (step S105). The judging method includes the following three methods.

First Judging Method

Whether the peak value of the waveform of the emitted pulsed light falls within a predetermined range or whether it is greater than a predetermined value is judged. When the peak value of the waveform of the emitted pulsed light comes within the predetermined range or is greater than the predetermined value, the judgment in step S105 is YES. Otherwise, the judgment in step S105 is NO.

Second Judging Method

Whether the emitted pulsed light has a waveform with a single peak is judged. This is judged by counting the number of the peaks. When the emitted pulsed light is judged as having a single peak, the judgment is YES. When there are two or more of peaks, the judgment is NO. The peak is identified by an inflection point at which the sign of a time differential value of the waveform is inverted from positive to negative.

Third Judging Method

The symmetry of the shape of the emitted pulsed light on the time axis is evaluated, and the shape of the emitted pulsed light is determined as being symmetrical when satisfying a predetermined condition or it is determined as being asymmetrical otherwise. In this method, when the shape of the emitted pulsed light is determined as being symmetrical, the judgment is YES.

Hereinafter, an exemplary method of determining symmetry is described. First, the position of the peak of the pulse waveform on the time axis is obtained. Then, a deviation of the distribution of sampling points of the waveform between the right side and the left side on the time axis (before and after a certain time) is calculated. For example, the difference of the area of the waveform between the right side and the left side is used as an index for evaluating the deviation of the distribution of the sampling points of the waveform. When the deviation of the distribution of the sampling points of the pulse waveform of the emitted light between the right side and the left side is not greater than a predetermined threshold value, the pulse waveform of the emitted light is determined as being symmetrical. Otherwise, the pulse waveform of the emitted light is determined as being asymmetrical.

The above first to third judging methods may be used alone or in combination. For example, all of the three judging methods may be performed, and when at least one of the three judgments is YES, the judgment in step S105 is YES as a result. For another example, depending on the situation, the judging conditions may be prioritized (weighted), and the priority of the judging condition may be changed.

Hereinafter, an example is described. In one example, in the technology for measuring distances using pulsed light, when a target is distant, that is, the distance to be measured is relatively long, the intensity of the distance-measuring pulsed light is important, and thus, the condition of the first judging method is made more severe. Naturally, while the intensity of the emitted light is important, the negative influence of relaxation oscillation on the distance measurement accuracy cannot be ignored, and the waveform is still also important. Thus, the single peak and symmetry of the waveform are determined by moderating the judging conditions in advance, and then, whether the intensity of the pulsed light is not less than the threshold value is determined. In this case, the judgment is performed by giving priority to the intensity of the measurement light.

In another example, the pulse falls slowly at such a low rate that it may decrease the distance measurement accuracy, but it still has a single peak, and thus, the second judging method is difficult to use. In this case, the third judging method enables compensation of the pulse waveform.

When the waveform of the emitted pulsed light obtained in step S104 is judged as satisfying the predetermined condition in the judgment in step S105, the waveform of the emitted pulsed light needs no further compensation, and the compensation processing is terminated (step S106). Otherwise, the processing step advances to step S107, and the compensation processing is continued so that the waveform of the emitted pulsed light will satisfy the predetermined condition.

In step S107, the value of the output voltage of the power supply circuit 105 as shown in FIG. 3 is selected by referring to the waveform of the emitted pulsed light obtained in step S104. The processing performed in step S107 is described as follows. This processing is performed for determining power-supply voltage by referring to a preliminarily obtained base data of a relationship between the waveform of emitted light and the power-supply voltage. The base data includes data for determining (1) whether the power-supply voltage should be increased, to increase the peak value of the waveform of the emitted light, (2) whether the power-supply voltage should be increased, to make the emitted light reliably have a single peak, and (3) whether the power-supply voltage should be increased, to improve the symmetry of the waveform of the emitted light. The base data is prepared with respect to each temperature (for example, by each 1° C.) and is stored in an appropriate storage area of the operation part 109 in advance. In practical processing, the difference of the waveform of the emitted pulsed light obtained in step S104 from the target waveform is evaluated, and information of power-supply voltage necessary for reducing the difference is obtained from the above base data.

For example, when the peak value of the waveform of the emitted pulsed light is undesirably low, the value of the power-supply voltage is selected by referring to the preliminarily obtained correlation between the peak value and the power-supply voltage. Specifically, information for determining whether the power-supply voltage should be increased when the peak value is undesirably low is obtained from the preliminarily obtained relationship between the peak value of the waveform of the emitted pulsed light and the power-supply voltage, and a new value of power-supply voltage is selected.

For another example, when relaxation oscillation occurs, and there is a second pulse, information relating to how to vary the power-supply voltage is obtained from a preliminarily obtained relationship between the relaxation oscillation and the power-supply voltage, and a new value of the power-supply voltage is selected.

In yet another example, when the symmetry of the waveform of the emitted pulsed light is low, information relating to how to vary the power-supply voltage is obtained from a preliminarily obtained relationship between the symmetry of the pulse waveform of the emitted light and the power-supply voltage, and a new value of the power-supply voltage is selected.

The three factors: peak value, symmetry, and relaxation oscillation, may be prioritized in adjustment of the power-supply voltage. For example, when a long distance is to be measured, since the peak value of the emitted light is high priority, first, the power-supply voltage is varied so that the peak value of the waveform of the emitted pulsed light will come within a specified range or be at a specified value. Under conditions in which the peak value of the emitted light satisfies the specified condition, the power-supply voltage is adjusted in view of the other factors, as long as this condition is not changed.

After step S107, the processing in step S103 and the processing in the subsequent steps are performed using the varied power-supply voltage. The power-supply voltage affects each of the peak value, the single peak characteristic, and the symmetry of the waveform, and all of these factors may not be satisfactory to a degree by one compensation. In such a case, the adjustment in step S107 is performed by reducing variation in the power-supply voltage, and the processing in step S103 and the processing in the subsequent steps are performed again. Thus, the processing in step S107, step S103, step S104, and the subsequent steps is performed in this order one time or multiple times to search for a power-supply voltage that enables emission of pulsed light having a waveform satisfying the predetermined condition.

If the judgment in step S105 is not YES even after the processing is repeated a predetermined number of times, the following processing is performed as the next procedure. That is, the judging condition in step S105 is moderated to reduce the required level for the pulse waveform of the emitted light, and then, the processing in step S105 and in the subsequent steps is performed. In some cases, in the processing in step S107 and in the subsequent steps, the power-supply voltage may be varied incrementally to obtain the tendency of the variation in the waveform, and a power-supply voltage that enables providing a desired waveform may be searched for by trial and error. This procedure increases the number of emissions of light necessary for compensation, but enables fine compensation according to the situation.

Advantages

The above configuration reduces influences of variation in temperature and margin of error in precision of parts by varying the power-supply voltage. Moreover, variation in the pulse waveform of the emitted light due to change in the characteristics of parts with time is compensated as necessary. Thus, cost for setting and selecting parts and cost for adjusting the device are reduced. Also, a specific performance is constantly obtained. Specifically, when this embodiment of the present invention is used in a distance measuring device, the influence of temperature is suppressed without using a thermostat, whereby the distance measuring device is obtained at a low cost and exhibits high performance while consuming a small amount of power.

2. Second Embodiment

Figure 13A:
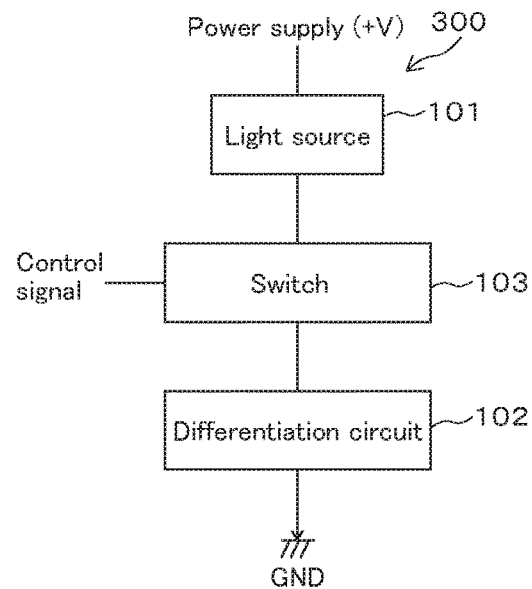
FIGS. 13A and 13B are block diagrams showing structures of other embodiments.
Figure 13B:
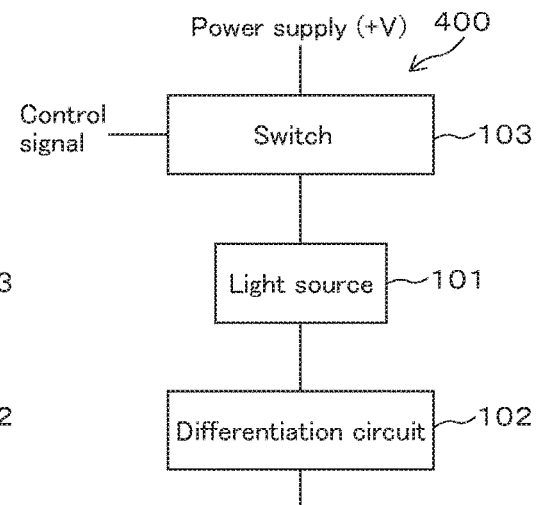

The serial connection order of the light source 101, the differentiation circuit 102, and the switch 103 is not limited to the configuration shown in FIG. 3 and may be configured as shown in FIG. 13A or 13B. FIG. 13A shows an example of serially arranging the light source 101, the switch 103, and the differentiation circuit 102, in this order, from a positive potential side. FIG. 13B shows an example of serially arranging the switch 103, the light source 101, and the differentiation circuit 102 in this order from a positive potential side. In this case, the differentiation circuit 102 and the switch 103, which are serially connected while having the light source 101 therebetween, constitute the light source driving circuit. The light source 101 is equivalently serially connected to the light source driving circuit, which includes the differentiation circuit 102 and the switch 103. Note that FIGS. 13A and 13B do not show the power supply circuit. FIGS. 13A and 13B show examples of applying a positive potential as power-supply voltage. However, for example, in the configuration shown in FIG. 13A, a negative power supply may be used to apply a negative potential to the part of the GND by grounding a part of the power supply (+V) so as to have a ground potential. This also applies to the case shown in FIG. 13B.

3. Third Embodiment

Figure 14:
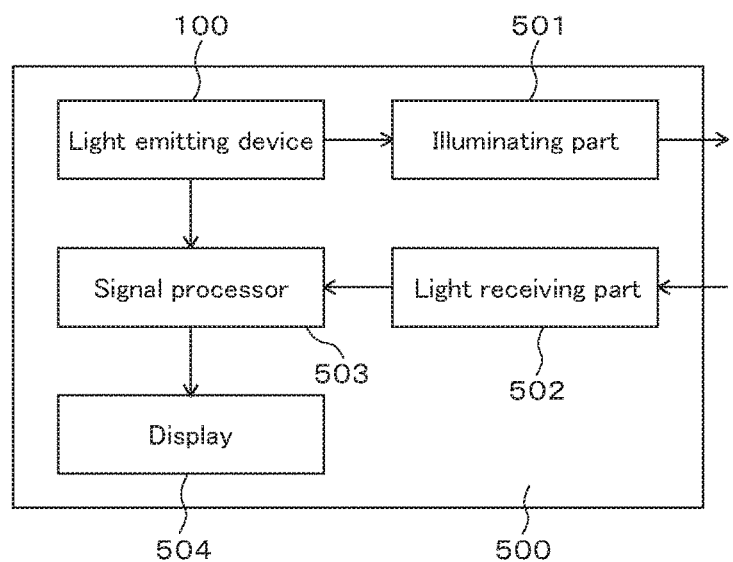
FIG. 14 is a block diagram of a distance measuring device using the present invention.

FIG. 14 shows a distance measuring device 500. The distance measuring device 500 measures a distance to an object to be measured using laser light and includes a light emitting device 100, an illuminating part 501, a light receiving part 502, a signal processor 503, and a display 504.

The light emitting device 100 has the structure as shown in FIGS. 3A, 3B, and 4. Naturally, another light emitting device exemplified in the present specification can also be used. The illuminating part 501 includes an optical system for illuminating an object to be measured with laser light output from the light emitting device 100. The light receiving part 502 includes an optical system and a light receiving element, such as a photodiode, and receives light, which is illuminated from the illuminating part 501 and is reflected by the object. The signal processor 503 calculates a distance to the object based on the detected light received by the light receiving part 502. The calculation performed in the signal processor 503 is the same as that in an ordinary laser distance measuring device. The display 504 is a displaying device, such as a liquid crystal display, and displays the distance to the object, which is calculated by the signal processor 503.

The distance measuring device 500 uses distance measuring light with a short pulse width generated by the light emitting device 100 and thus enables distance measurement with high accuracy. The light emitting device 100 has a simple structure and consumes a small amount of electric power, and it can be produced at low production cost. Consequently, the distance measuring device 500 can be reduced in size, have lower electric power consumption, and be less expensive to produce.

Although the laser distance measuring device is exemplified as an example embodying the light source of the present invention here, the light source of the present invention, which emits pulsed light using the differentiation circuit, can be applied to any type of device using pulsed light, such as a laser machining device or other device.

The invention claimed is:
1. A light emitting device comprising:
a semiconductor laser that emits light having relaxation oscillation immediately after being supplied with electric current;
a light source driving circuit that includes a differentiation circuit having a resistor and a capacitor in parallel connection and that includes a switching element for applying voltage in serial connection to the differentiation circuit, the voltage applied using a first voltage ($V_{cs}$) via a first electrode of the differentiation circuit that is proximal to the semiconductor laser and a second voltage ($V_d$) via a second electrode of the differentiation circuit that is proximal to the switching element, and the light source driving circuit being serially connected to the semiconductor laser;
a power supply that applies voltage to the serial circuit of the semiconductor laser and the light source driving circuit;
a light measuring part that measures the light emitted from the semiconductor laser; and
a voltage controlling part that controls the voltage to be applied to the semiconductor laser in response to a waveform of the light measured by the light measuring part,
wherein the emitted light having the relaxation oscillation has an initial pulse having a highest peak intensity value at an initial stage of the light emission and has subsequent pulses of which peak intensities gradually decrease at a subsequent stage of the light emission, and the initial pulse is generated immediately after application of a driving current is started,
a voltage that exceeds a light emission threshold voltage of the semiconductor laser is applied to the semiconductor laser in response to turning on the switching element, and
a resistance value of the resistor and a capacitance value of the capacitor of the differentiation circuit are set so that a voltage lower than the light emission threshold voltage of the semiconductor laser is applied to the semiconductor laser at a stage in which the semicon- ductor laser has performed the emission of the light having the highest peak intensity value of the relaxation oscillation.

* * * * *